(12) United States Patent
Komori

(10) Patent No.: US 6,844,228 B2
(45) Date of Patent: Jan. 18, 2005

(54) MANUFACTURING METHOD OF A SEMICONDUCTOR DEVICE CAPABLE OF ACCURATELY SETTING A RESISTANCE VALUE OF A RESISTANCE ELEMENT

(75) Inventor: Shigeki Komori, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 26 days.

(21) Appl. No.: 10/700,770

(22) Filed: Nov. 5, 2003

(65) Prior Publication Data

US 2004/0248358 A1 Dec. 9, 2004

(30) Foreign Application Priority Data

Jun. 3, 2003 (JP) ........................................ 2003-157971

(51) Int. Cl.[7] ................. H01L 21/8244; H01L 21/8234
(52) U.S. Cl. ....................... 438/238; 438/382; 438/384; 438/649; 438/659; 438/239; 438/385; 438/241
(58) Field of Search ................................ 438/238, 239, 438/241, 381, 382, 383, 649, 659, 385, 513, 258

(56) References Cited

U.S. PATENT DOCUMENTS 6,165,861 A * 12/2000 Liu et al. .................... 438/382
2002/0127791 A1 * 9/2002 Nanjo et al. ................. 438/231

FOREIGN PATENT DOCUMENTS

| JP | 59-16361 | 1/1984 |
|----|----------|--------|
| JP | 6-314770 | 11/1994 |
| JP | 11-251520 | 9/1999 |
| JP | 3153921 | 2/2001 |

\* cited by examiner

*Primary Examiner*—Matthew Smith
*Assistant Examiner*—Igwe U. Anya
(74) *Attorney, Agent, or Firm*—Oblon, Spivak, McClelland, Maier & Neustadt, P.C.

(57) ABSTRACT

A photoresist (6) is formed on an element isolation insulating film (2) so as to cover the upper and side surfaces of a polysilicon film (4R) which functions as a resistance element. With the photoresist (6) as an implantation mask, n-type impurities (7) such as phosphorus are ion-implanted from a direction substantially normal to the upper surface of a silicon substrate (1). The dose is in the order of $10^{13}/cm^2$. Through this processing, an LDD region (8) of MOSFET is formed inside the upper surface of the silicon substrate (1) within a transistor forming region. The impurities (7) are also implanted in a polysilicon film (4G). On the other hand, as the polysilicon film (4R) is covered by the photoresist (6), the impurities (7) are not implanted into the polysilicon film (4R).

11 Claims, 16 Drawing Sheets

F I G . 1
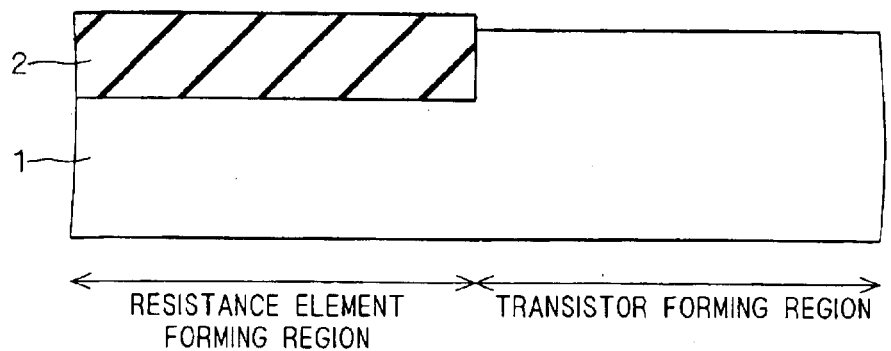
F I G . 2
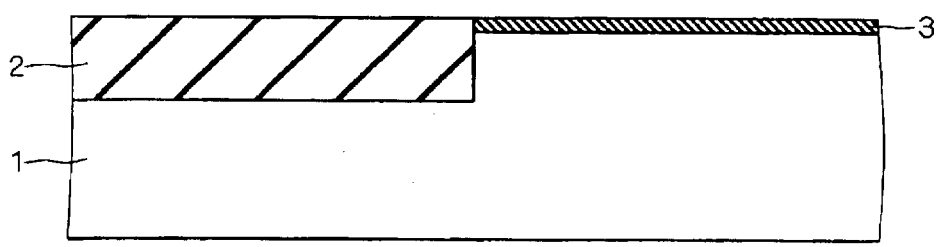
F I G . 3
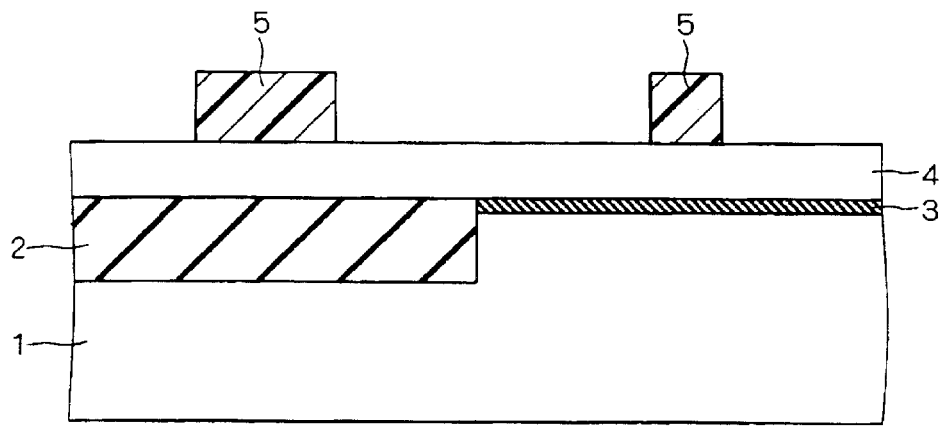

F I G. 6
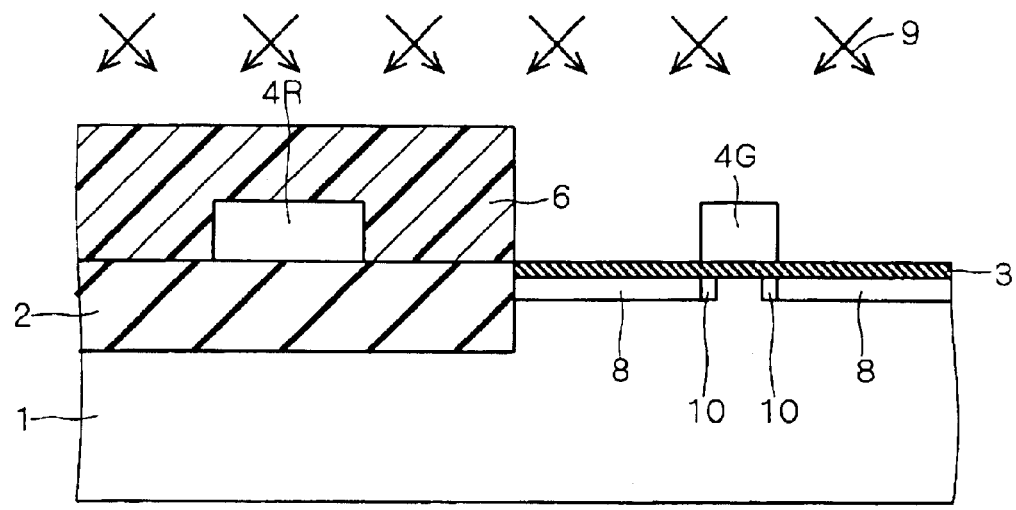
F I G. 7
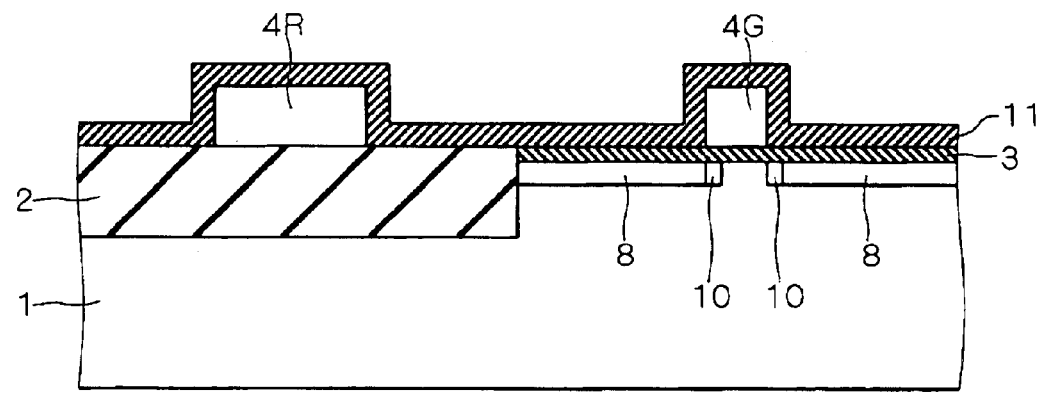

MANUFACTURING METHOD OF A SEMICONDUCTOR DEVICE CAPABLE OF ACCURATELY SETTING A RESISTANCE VALUE OF A RESISTANCE ELEMENT

BACKGROUND OF THE INVENTION

1. Field of the Invention

This invention relates to a manufacturing method of a semiconductor device, and more particularly to a manufacturing method of a semiconductor device including a transistor and a resistance element formed on an element isolation insulating film.

2. Description of the Background Art

LSI is constituted by transistors, resistance elements, and others. As one of the resistance elements, a resistance element formed by doping impurities into a polysilicon film (referred to as "polysilicon resistor" in this specification) is widely used. In general, the resistance value of the polysilicon resistor depends on the amount of impurities contained in the polysilicon film.

Hereinafter, a conventional manufacturing method of a semiconductor device including an n-channel MOSFET and a polysilicon resistor will be explained. This conventional manufacturing method of a semiconductor device includes the steps of (a) forming an element isolation insulating film inside an upper surface of a p-type silicon substrate, (b) forming a gate insulating film of MOSFET on the upper surface of the silicon substrate within an element forming region, (c) forming a first polysilicon film containing no doped impurities on the entire surface, (d) by patterning the first polysilicon film, forming a second polysilicon film functioning as a polysilcon resistor on the element isolation insulating film and forming a third polysilicon film functioning as a gate electrode of MOSFET on the gate insulating film, (e) forming an LDD region (which may be referred to as "extension region") of MOSFET by ion-implanting n-type first impurities from a direction substantially normal to the upper surface of the silicon substrate (i.e., from the vertical direction), (f) forming a pocket region of MOSFET by ion-implanting p-type second impurities from a direction inclined relative to the above-described vertical direction, (g) forming a sidewall spacer on a side surface of the second polysilicon film, (h) by ion-implanting n-type third impurities from the direction substantially normal to the upper surface of the silicon substrate, forming a source-drain region of MOSFET, and setting a resistance value of the polysilicon resistor by ion-implanting the third impurities into the second polysilicon film, and (i) performing a thermal treatment to activate the first to third impurities implanted in the silicon substrate.

The techniques relating to the manufacturing method of a polysilicon resistor are, for example, disclosed in Japanese Patent No. 3153921, Japanese Patent Application Laid-open No. 59-16361(1984), Japanese Patent Application Laid-open No. 6-314770 (1994), and Japanese Patent Application Laid-open No. 11-251520(1999).

Recently, from the needs of realizing high-performance semiconductor devices, IC chips mounting both a digital circuit and an analog circuit are widely used. Especially, from the reason that the resistance element is utilized for a bias setting or the like of a transistor, the analog circuit is required to accurately set its resistance value.

However, according to the conventional manufacturing method of a semiconductor device, not only the third impurities but also the first and second impurities are ion-implanted into the second polysilicon film. Namely, a plurality kinds of impurities are implanted in the second polysilicon film. Furthermore, part of the first to third impurities contained in the second polysilicon film diffuses out of the second polysilicon film (i.e., causes external diffusion) when they are subjected to the thermal treatment in the step (i). Furthermore, there is the possibility that a significant temperature difference is caused within a wafer surface during the thermal treatment. In this case, the external diffusion amount of the impurities will disperse on the wafer surface.

As described above, according to the conventional manufacturing method of a semiconductor device, it was difficult to set the resistance value of a polysilicon resistor to a desired value. Furthermore, the resistance value disperses in the wafer surface even if resistance elements are the same in size.

SUMMARY OF THE INVENTION

It is an object of the present invention to provide a manufacturing method of a semiconductor device which is capable of accurately setting a resistance value of a resistance element and is also capable of suppressing unevenness in the resistance value on a wafer surface.

According to the present invention, a manufacturing method of a semiconductor device includes the following steps (a) to (i). The step (a) is to form an element isolation insulating film in a main surface of a semiconductor substrate. The step (b) is to form a gate insulating film on the main surface of the semiconductor substrate in an element forming region defined by the element isolation insulating film. The step (c) is to form a semiconductor film on the element isolation insulating film and on the gate insulating film. The step (d) is to form a resistance element on the element isolation insulating film and form a gate electrode on the gate insulating film by patterning the semiconductor film. The step (e) is to form a mask material so as to cover the resistance element. The step (f) is to form a first source-drain region in the main surface of the semiconductor substrate in the element forming region by ion-implanting first impurities of a first conductivity type with the mask material as an implantation mask. The step (g) is to form a sidewall spacer on a side surface of the resistance element, and is executed after the step (f). The step (h) is executed after the step (g). The step (h) is to implant second impurities of the first conductivity type into the resistance element by ion-implanting the second impurities and form a second source-drain region in the main surface of the semiconductor substrate in the element forming region. The step (i) is to perform a thermal treatment to activate the second impurities.

The resistance value of the resistance element can be accurately set.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 1 to 11 are cross-sectional views showing the sequence of manufacturing processes in a manufacturing method of a semiconductor device in accordance with a first preferred embodiment of the present invention;

DESCRIPTION OF THE PREFERRED EMBODIMENTS

First Preferred Embodiment

Figure 4:
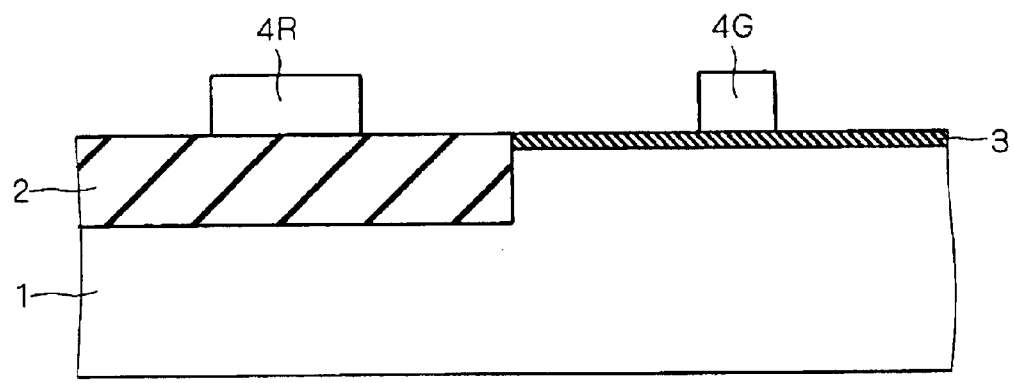

FIGS. 1 to 11 are cross-sectional views showing the sequence of manufacturing processes in a manufacturing method of a semiconductor device in accordance with a first preferred embodiment of the present invention. The first preferred embodiment will be explained based on an example in which an n-channel MOSFET is formed as a transistor.

With reference to FIG. 1, first of all, an element isolation insulating film 2 is partly formed in an upper surface of a p-type silicon substrate 1 by using a well-known trench isolation technique. The silicon substrate 1 has a region where a resistance element is to be formed (referred to as a resistance element forming region) and a region where a transistor is to be formed (referred to as a transistor forming region). The resistance element forming region is located on the element isolation region. The transistor forming region is located on an element forming region. The element isolation insulating film 2 is made of an silicon dioxide ($SiO_2$) and is formed in the upper surface of the silicon substrate 1 in the resistance element forming region. The transistor forming region is defined by the element isolation insulating film 2.

With reference to FIG. 2, next, a silicon oxide film 3 is formed by using a thermal oxidation method. The silicon oxide film 3 is formed on the upper surface of the silicon substrate 1 in the transistor forming region.

With reference to FIG. 3, next, a polysilicon film 4 containing no doped impurities is formed by using the CVD method. The polysilicon film 4 is formed on the entire surface of the structure shown in FIG. 2. More specifically, the polysilicon film 4 is formed on the element isolation insulating film 2 and the silicon oxide film 3. Next, a photoresist 5 having a predetermined opening pattern is formed on the polysilicon film 4 by using a photolithography technique.

With reference to FIG. 4, next, with the photoresist 5 as an etching mask, the polysilicon film 4 is partly removed by using an anisotropic dry etching method. Through this processing, the polysilicon film 4 is patterned to form polysilicon films 4R and 4G. The polysilicon film 4R, functioning as a resistance element, is formed on the element isolation insulating film 2. The polysilicon film 4G, functioning as a gate electrode of MOSFET, is formed on the silicon oxide film 3. The silicon oxide film 3 located at a portion sandwiched between the polysilicon film 4G and the silicon substrate 1 functions as a gate insulating film. Then, the photoresist 5 is removed.

Figure 5:
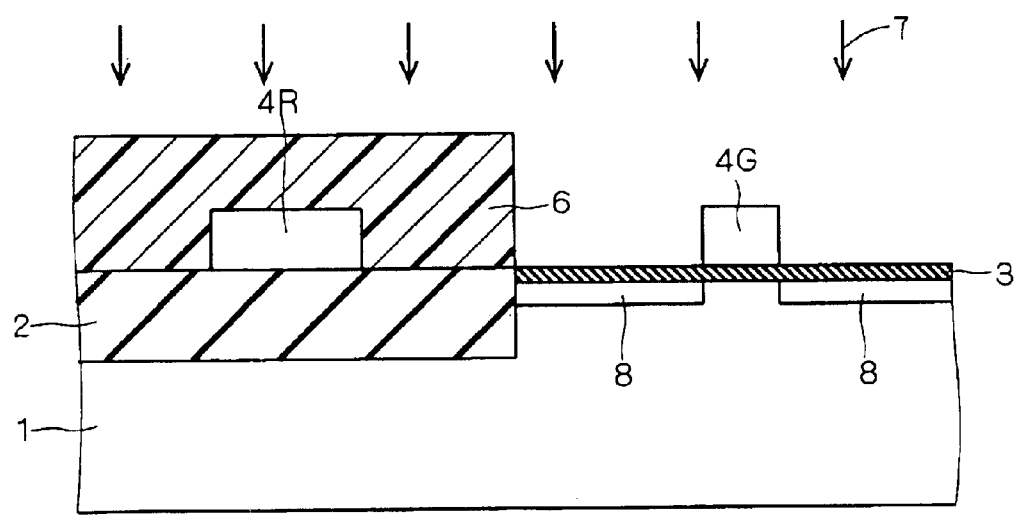

With reference to FIG. 5, next, a photoresist 6 is formed by using the photolithography technique. The photoresist 6 is formed on the element isolation insulating film 2 so as to cover the upper surface and the side surface of the polysilicon film 4R. Next, with the photoresist 6 as an implantation mask, n-type impurities 7 such as phosphorus (P) are ion-implanted from a direction substantially normal to the upper surface of the silicon substrate 1 (i.e., from the vertical direction). The dose is in the order of $10^{13}/cm^2$. Through this processing, an LDD region (i.e., first source-drain region) 8 of MOSFET is formed in the upper surface of the silicon substrate 1 in the transistor forming region. The impurities 7 are also implanted into the polysilicon film 4G. On the other hand, as the polysilicon film 4R is covered by the photoresist 6, the impurities 7 are not implanted into the polysilicon film 4R.

With reference to FIG. 6, next, with the photoresist 6 as an implantation mask, p-type impurities 9 such as boron (B) are implanted from a direction inclined with respect to the above-described vertical direction. The dose is in the order of $10^{14}/cm^2$. Through this processing, a pocket region 10 of MOSFET is formed in the upper surface of the silicon substrate 1 in the transistor forming region. The pocket region 10 is formed under an end of the polysilicon film 4G. The impurities 9 are also implanted into the side surface of the polysilicon film 4G. On the other hand, as the polysilicon film 4R is covered by the photoresist 6, the impurities 9 are not implanted into the polysilicon film 4R.

With reference to FIG. 7, next, the photoresist 6 is removed. Then, a silicon oxide film 11 is entirely formed on the structure shown in FIG. 6 by using the CVD method.

Figure 8:
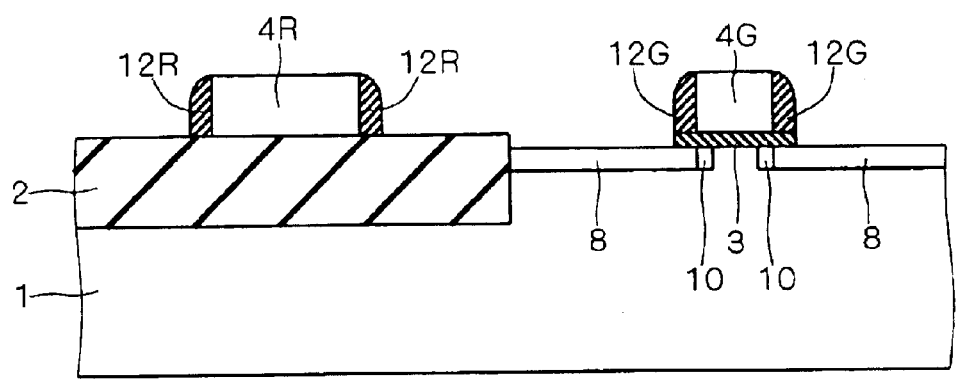

With reference to FIG. 8, next, the silicon oxide film 11 is etched by using the anisotropic dry etching method. Through this processing, a sidewall spacer 12R is formed on the side surface of the polysilicon film 4R and a sidewall spacer 12G is also formed on the side surface of the polysilicon film 4G. Furthermore, as a result of partly removing the silicon oxide film 3, the upper surface of the LDD region 8 is partly exposed.

Figure 9:
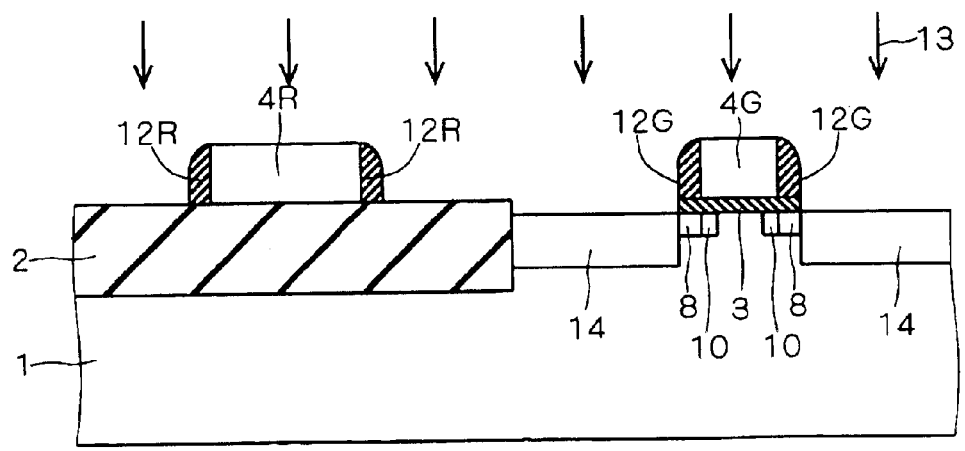

With reference to FIG. 9, next, n-type impurities 13 such as arsenic (As) or phosphorus are ion-implanted from a direction substantially normal to the upper surface of the silicon substrate 1. The dose is in the order of $10^{15}/cm^2$. Through this processing, a source-drain region (i.e., second source-drain region) 14 of MOSFET is formed in the upper surface of the silicon substrate 1 in the transistor forming region. The source-drain region 14 has a higher concentration compared with the LDD region 8. Furthermore, the source-drain region 14 is deeper than the LDD region 8. The impurities 13 are also implanted into the polysilicon films 4G and 4R. Then, a predetermined thermal treatment is performed to activate the LDD region 8, the pocket region 10, and the source-drain region 14.

Figure 10:
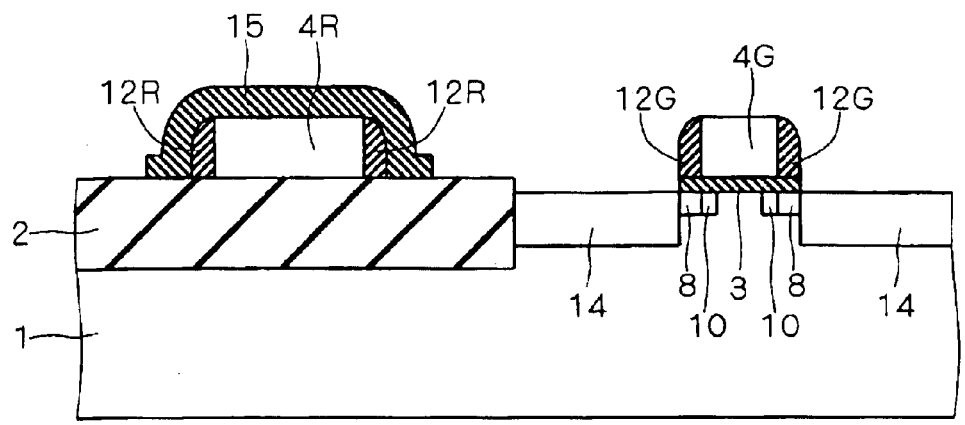

With reference to FIG. 10, next, a silicon oxide film 15 is formed by using the CVD method, the photolithography technique, and the anisotropic dry etching method. The silicon oxide film 15 is formed on the element isolation insulating film 2 so as to cover the polysilicon film 4R and the sidewall spacer 12R.

Figure 11:
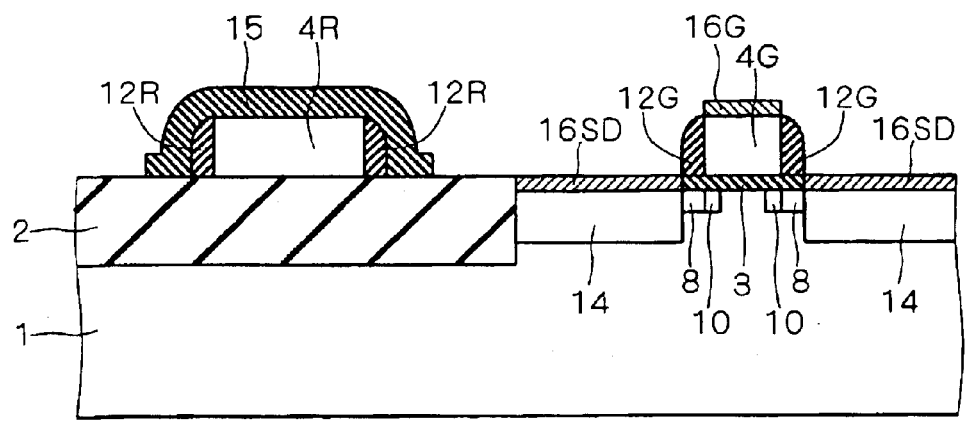

With reference to FIG. 11, next, a metallic film of cobalt (Co) or the like is formed on the entire surface of the structure shown in FIG. 10. Subsequently, cobalt silicide layers 16G and 16SD are formed by performing a predetermined thermal treatment. The cobalt silicide layer 16G is formed on the polysilicon film 4G, while the cobalt silicide layer 16SD is formed on the source-drain region 14. As the silicon oxide film 15 functions as a silicide protection film, no cobalt silicide layer is formed on the polysilicon film 4R.

As described above, according to the manufacturing method of a semiconductor device in accordance with the first preferred embodiment, the polysilicon film 4R is covered by the photoresist 6 in the processes shown in FIGS. 5 and 6. Thus, the impurities 7 and 9 are not implanted into the polysilicon film 4R. Accordingly, in the process shown in FIG. 9, only the impurities 13 are implanted into the polysilicon film 4R which functions as a resistance element. Namely, only one kind of impurities is implanted inside the polysilicon film 4R. Hence, it becomes possible to accurately set a resistance value of the resistance element when compared with a conventional manufacturing method of a semiconductor device according to which a plurality kinds of impurities having mutually different conductance type are implanted in the resistance element.

Second Preferred Embodiment

Figure 12:
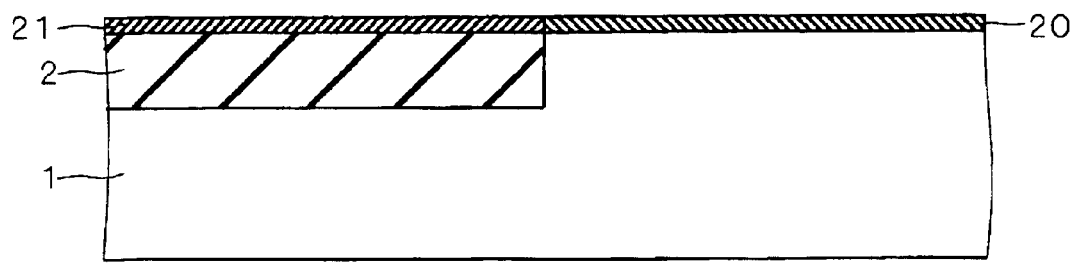
FIGS. 12 to 18 are cross-sectional views showing the sequence of manufacturing processes in a manufacturing method of a semiconductor device in accordance with a second preferred embodiment of the present invention.

FIGS. 12 to 18 are cross-sectional views showing the sequence of manufacturing processes in a manufacturing method of a semiconductor device in accordance with a second preferred embodiment of the present invention. First of all, the structure shown in FIG. 2 is obtained by using a method similar to that disclosed in the above-described first preferred embodiment. With reference to FIG. 12, next, the silicon oxide film 3 and an upper surface of the element isolation insulating film 2 are nitrided by performing a predetermined thermal treatment in a nitrogen atmosphere. Through this processing, silicon nitride films 20 and 21 are formed. The silicon nitride film 20 is formed on the upper surface of the silicon substrate 1, while the silicon nitride film 21 is formed on the element isolation insulating film 2.

Figure 13:
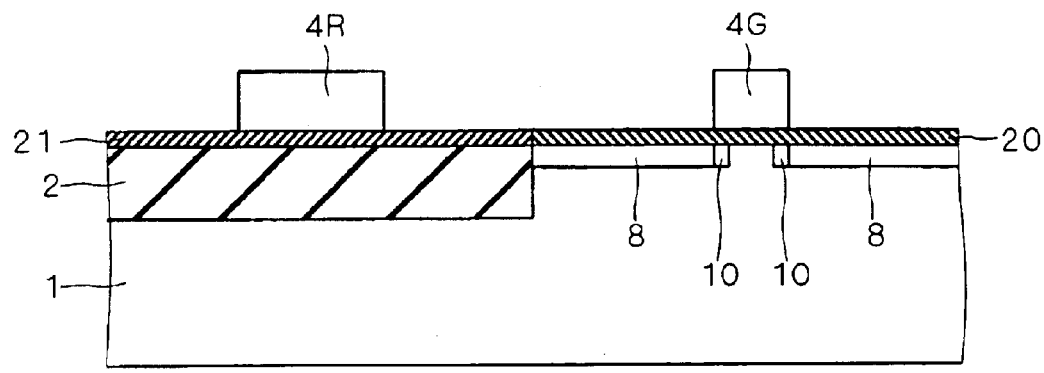

With reference to FIG. 13, next, the polysilicon films 4R and 4G, the LDD region 8, and the pocket region 10 are formed by using a method similar to that disclosed in the fist preferred embodiment. The polysilicon film 4R is formed on the silicon nitride film 21, while the polysilicon film 4G is formed on the silicon nitride film 20.

Figure 14:
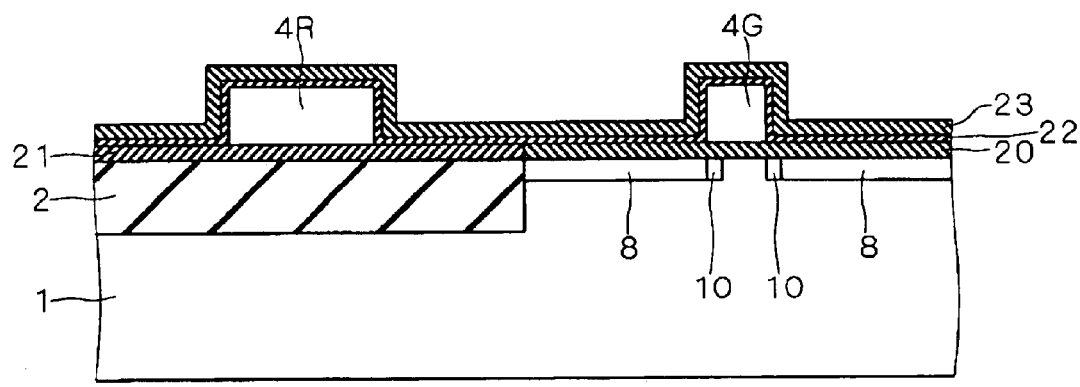

With reference to FIG. 14, next, a silicon nitride film 22 is formed on the entire surface of the structure shown in FIG. 13 by using the CVD method. Then, a silicon oxide film 23 is formed on the silicon nitride film 22 by using the CVD method.

Figure 15:
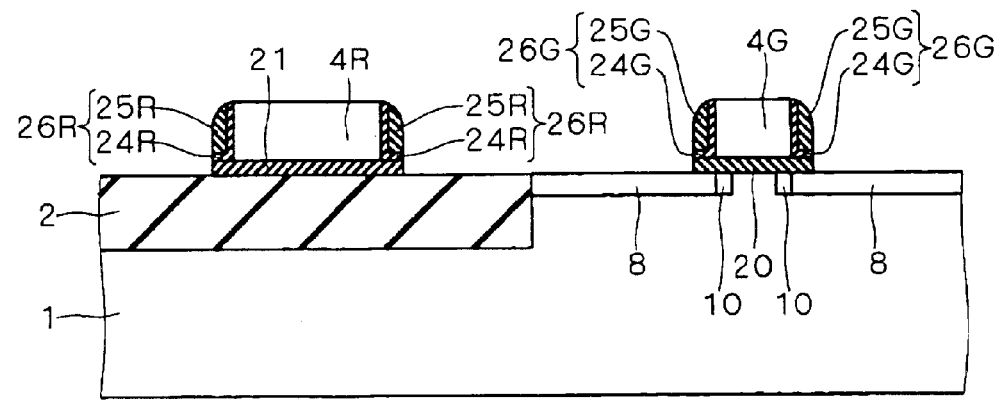

With reference to FIG. 15, next, the silicon oxide film 23 and the silicon nitride films 20 to 22 are etched by using the anisotropic dry etching method. Through this processing, a sidewall spacer 26R is formed on the side surface of the polysilicon film 4R and a sidewall spacer 26G is formed on the side surface of the polysilicon film 4G. The sidewall spacer 26R has a silicon nitride film 24R and a silicon oxide film 25R. The sidewall spacer 26G has a silicon nitride film 24G and a silicon oxide film 25G. The silicon nitride film 24R is formed on the side surface of the polysilicon film 4R. The silicon nitride film 24G is formed on the side surface of the polysilicon film 4G. Furthermore, as a result of partly removing the silicon nitride films 20 and 21, each upper surface of the LDD region 8 and the element isolation insulating film 2 is partly exposed.

Figure 16:
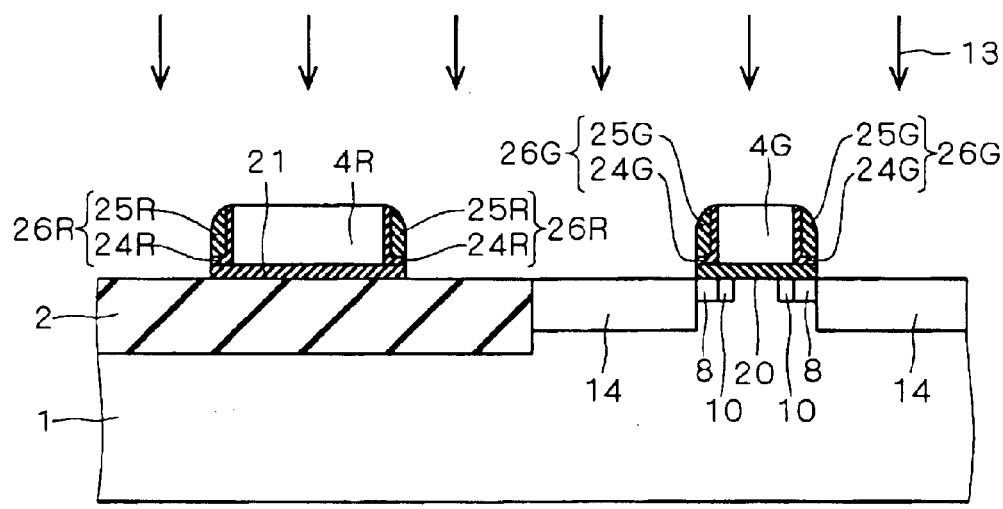

With reference to FIG. 16, next, n-type impurities 13 are ion-implanted from a direction substantially normal to the upper surface of the silicon substrate 1. Through this processing, the source-drain region 14 of MOSFET is formed.

Figure 17:
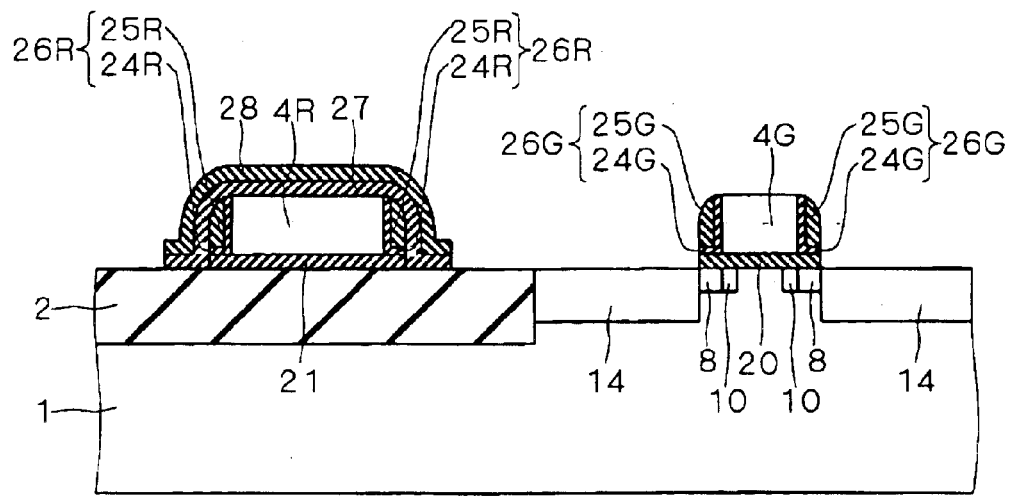

With reference to FIG. 17, next, a silicon nitride film is formed on the entire surface of the structure shown in FIG. 16 by using the CVD method. Then, a silicon oxide film is formed on the silicon nitride film by using the CVD method. Then, these films are patterned by using the photolithography technique and the anisotropic dry etching method to form a silicon nitride film 27 and a silicon oxide film 28. The silicon nitride film 27 is formed on the element isolation insulating film 2 so as to cover the upper surface of the polysilicon film 4R and the sidewall spacer 26R. Next, a predetermined thermal treatment is performed to activate the LDD region 8, the pocket region 10, and the source-drain region 14.

Figure 18:
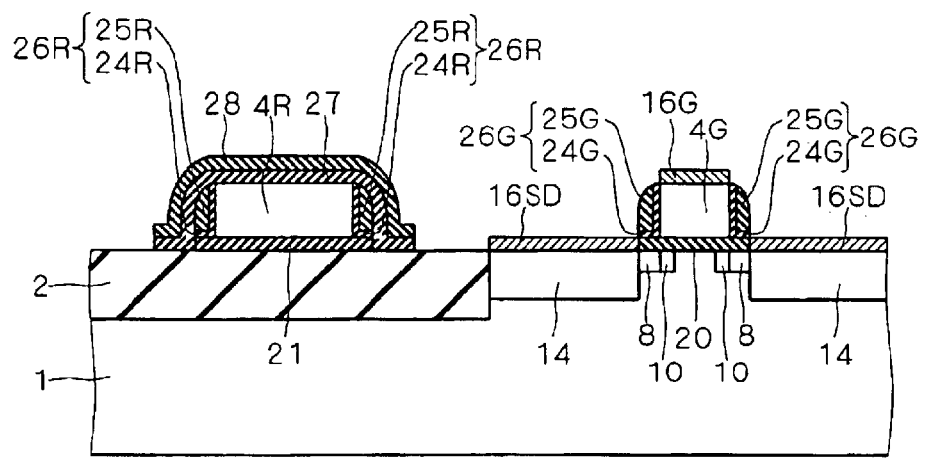

With reference to FIG. 18, next, a metal of cobalt or the like is formed on the entire surface of the structure shown in FIG. 17. Subsequently, cobalt silicide layers 16G and 16SD are formed by performing a predetermined thermal treatment. As the silicon nitride film 27 and the silicon oxide film 28 function as silicide protection films, no cobalt silicide layer is formed on the polysilicon film 4R.

As described above, according to the manufacturing method of a semiconductor device in accordance with the second preferred embodiment, the surface (i.e., bottom surface, side surface and upper surface) of the polysilicon film 4R is covered by the silicon nitride films 21, 24R and 27 as shown in FIG. 17. Furthermore, under the condition that the surface of the polysilicon film 4R is covered by the silicon nitride films 21, 24R and 27, the thermal treatment is performed to activate the impurities 7, 9 and 13. Accordingly, by the functions of the silicon nitride films 21, 24R and 27, it becomes possible to prevent the impurities 13 contained in the polysilicon film 4R from diffusing out of the polysilicon film 4R during this thermal treatment (i.e., the thermal treatment for forming the cobalt silicide layers 16G and 16SD). As a result, it becomes possible to accurately set a resistance value of the resistance element. Furthermore, it becomes possible to suppress unevenness in the resistance value of the resistance element on the wafer surface.

Figure 19:
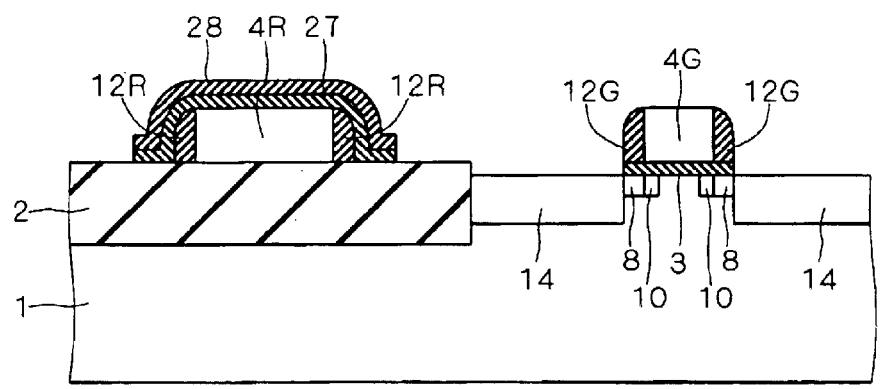
FIGS. 19 and 20 are cross-sectional views showing the sequence of manufacturing processes in a manufacturing method of a semiconductor device in accordance with a first modification of the second preferred embodiment.
Figure 20:
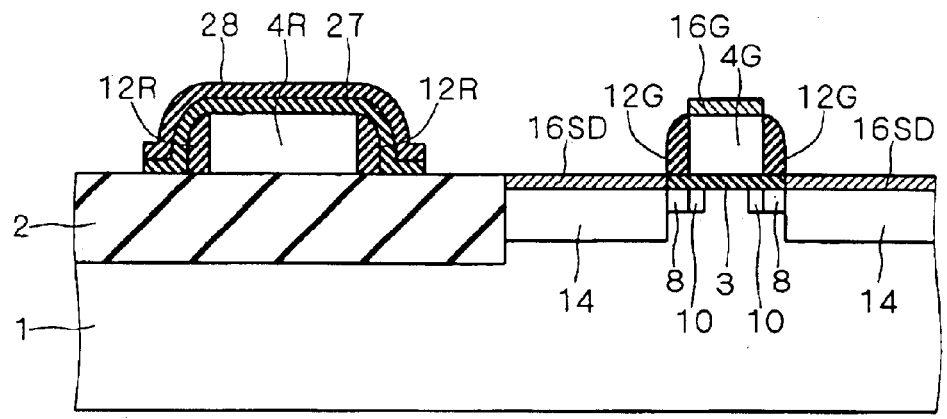

As a first modification, it is possible to form only the silicon nitride film 27 among the silicon nitride films 21, 24R and 27. FIGS. 19 and 20 are cross-sectional views showing the sequence of manufacturing processes in a manufacturing method of a semiconductor device in accordance with the first modification of the second preferred embodiment. First, the structure shown in FIG. 9 is formed by using a method similar to that disclosed in the above-described first preferred embodiment. With reference to FIG. 19, next, the silicon nitride film 27 and the silicon oxide film 28 are formed by using a method similar to the process shown in FIG. 17. Next, a predetermined thermal treatment is performed to activate the LDD region 8, the pocket region 10, and the source-drain region 14.

With reference to FIG. 20, next, the cobalt silicide layers 16G and 16SD are formed by using a method similar to the process shown in FIG. 18.

According to the manufacturing method of a semiconductor device in accordance with the first modification of the second preferred embodiment, the upper surface of the polysilicon film 4R is covered by the silicon nitride films 27 as shown in FIG. 19. Furthermore, under the condition that the upper surface of the polysilicon film 4R is covered by the silicon nitride film 27, the thermal treatment is performed to activate the LDD region 8, the pocket region 10, and the source-drain region 14. Accordingly, by the function of the silicon nitride film 27, it becomes possible to prevent the impurities 13 contained in the polysilicon film 4R from diffusing out of the upper surface of the polysilicon film 4R during this thermal treatment (i.e., the thermal treatment for forming the cobalt silicide layers 16G and 16SD).

Figure 21:
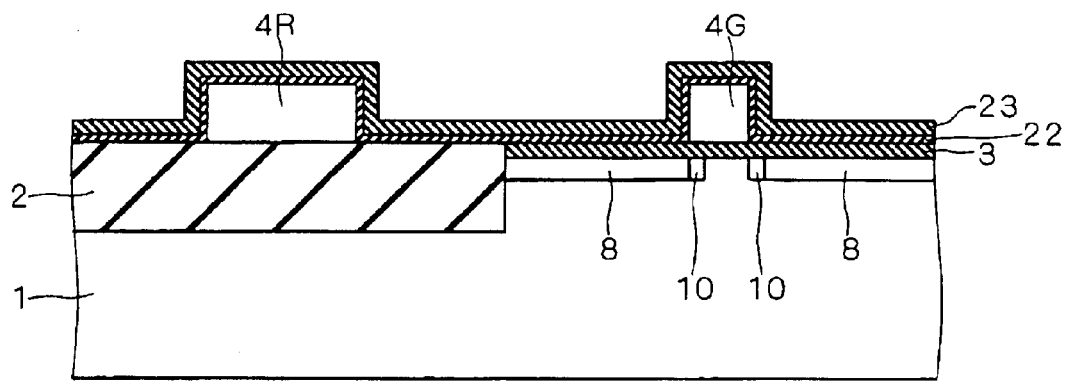
FIGS. 21 and 25 are cross-sectional views showing the sequence of manufacturing processes in a manufacturing method of a semiconductor device in accordance with a second modification of the second preferred embodiment.
Figure 25:
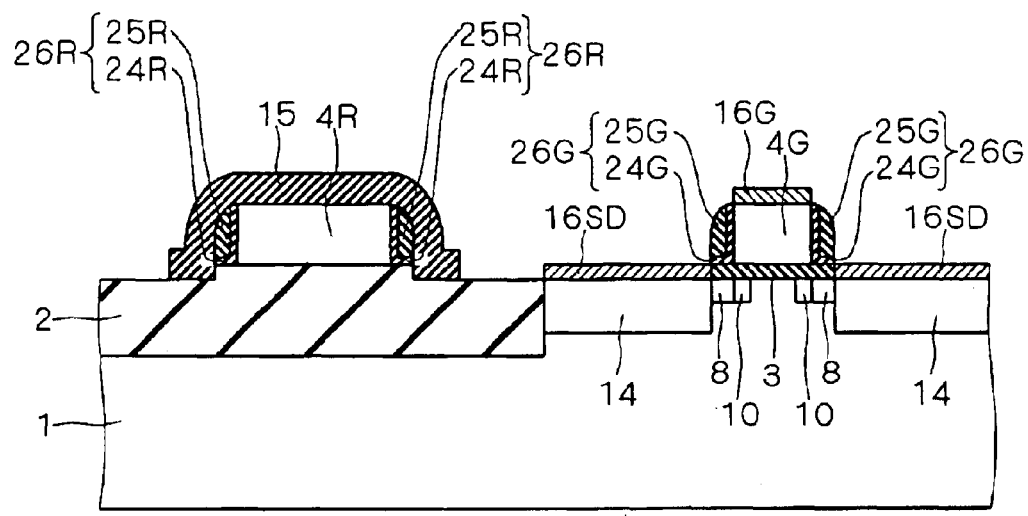

As a second modification, it is possible to form only the silicon nitride film 24R among the silicon nitride films 21, 24R and 27. FIGS. 21 and 25 are cross-sectional views showing the sequence of manufacturing processes in a manufacturing method of a semiconductor device in accordance with the second modification of the second preferred embodiment. First, the structure shown in FIG. 6 is formed by using a method similar to that disclosed in the above-described first preferred embodiment. With reference to FIG. 21, next, the photoresist 6 is removed. Then, the silicon nitride film 22 and the silicon oxide film 23 are formed by using a method similar to the process shown in FIG. 14.

Figure 22:
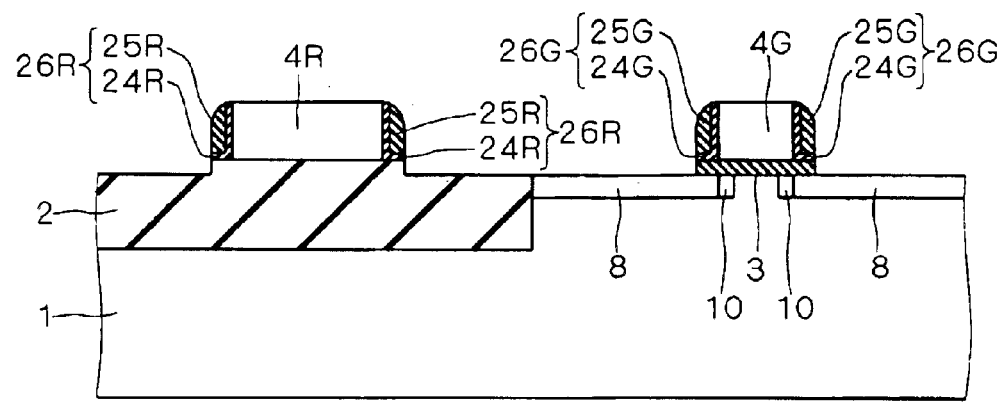

With reference to FIG. 22, the sidewall spacers 26R and 26G are formed by using a method similar to the process shown in FIG. 15.

Figure 23:
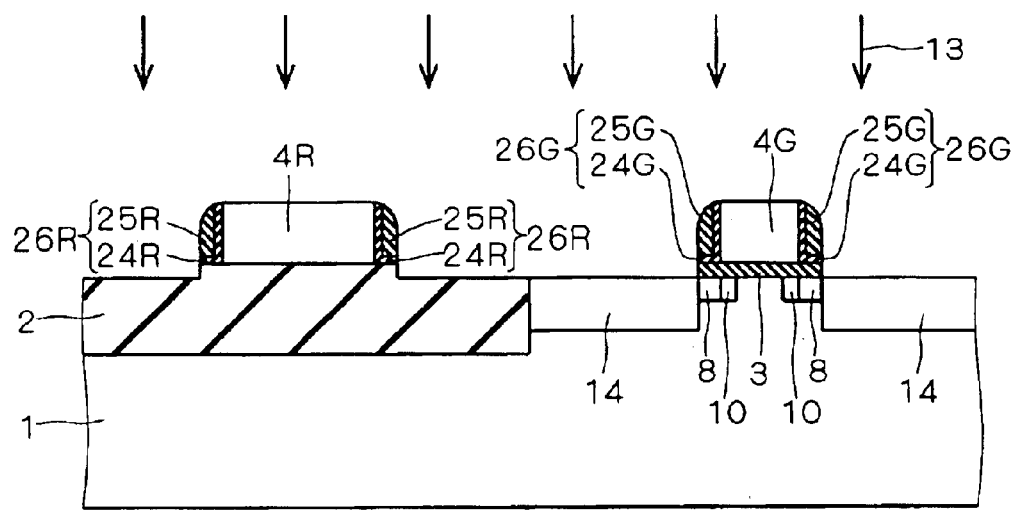

With reference to FIG. 23, next, the source-drain region 14 of MOSFET is formed by using a method similar to the process shown in FIG. 16. Then, a predetermined thermal treatment is performed to activate the LDD region 8, the pocket region 10, and the source-drain region 14.

Figure 24:
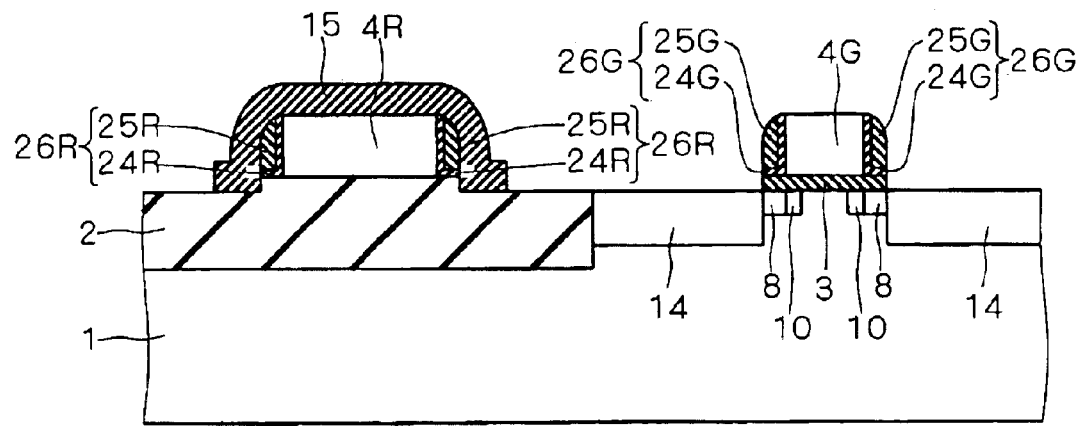

With reference to FIG. 24, next, the silicon oxide film 15 is formed by using a method similar to the process shown in FIG. 10.

With reference to FIG. 25, next, the cobalt silicide layers 16G and 16SD are formed by using a method similar to the process shown in FIG. 11.

According to the manufacturing method of a semiconductor device in accordance with the second modification of the second preferred embodiment, the side surface of the polysilicon film 4R is covered by the silicon nitride film 24R as shown in FIG. 23. Furthermore, under the condition that the side surface of the polysilicon film 4R is covered by the silicon nitride film 24R, the thermal treatment is performed to activate the LDD region 8, the pocket region 10, and the source-drain region 14. Accordingly, by the function of the silicon nitride film 24R, it becomes possible to prevent the impurities 13 contained in the polysilicon film 4R from diffusing out of the side surface of the polysilicon film 4R during this thermal treatment (i.e., the thermal treatment for forming the cobalt silicide layers 16G and 16SD).

As a third modification, it is possible to form only the silicon nitride film 21 among the silicon nitride films 21, 24R and 27. Instead of forming the sidewall spacers 26R and 26G shown in FIG. 15, the sidewall spacers 12R and 12G shown in FIG. 8 are formed. Furthermore, instead of forming the silicon nitride film 27 and the silicon oxide film 28 shown in FIG. 17, the silicon oxide film 15 shown in FIG. 10 is formed. By this modification, it becomes possible to form only the silicon nitride film 21 among the silicon nitride films 21, 24R and 27.

According to the manufacturing method of a semiconductor device in accordance with the third modification of the second preferred embodiment, the bottom surface of the polysilicon film 4R is covered by the silicon nitride film 21. Furthermore, under the condition that the bottom surface of the polysilicon film 4R is covered by the silicon nitride film 21, the thermal treatment is performed to activate the LDD region 8, the pocket region 10, and the source-drain region 14. Accordingly, by the function of the silicon nitride film 21, it becomes possible to prevent the impurities 13 contained in the polysilicon film 4R from diffusing out of the bottom surface of the polysilicon film 4R during this thermal treatment (i.e., the thermal treatment for forming the cobalt silicide layers 16G and 16SD).

As a fourth modification, it is possible to arbitrarily form two of the silicon nitride films 21, 24R and 27.

Third Preferred Embodiment

Figure 26:
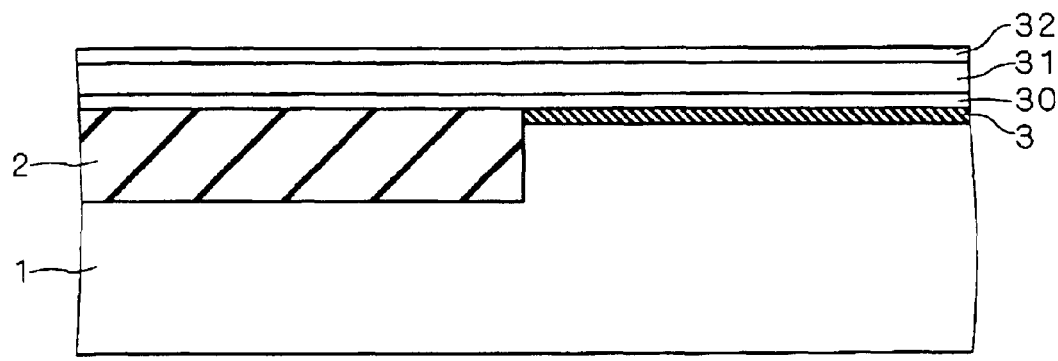
FIGS. 26 to 28 are cross-sectional views showing the sequence of manufacturing processes in a manufacturing method of a semiconductor device in accordance with a third preferred embodiment of the present invention.
Figure 27:
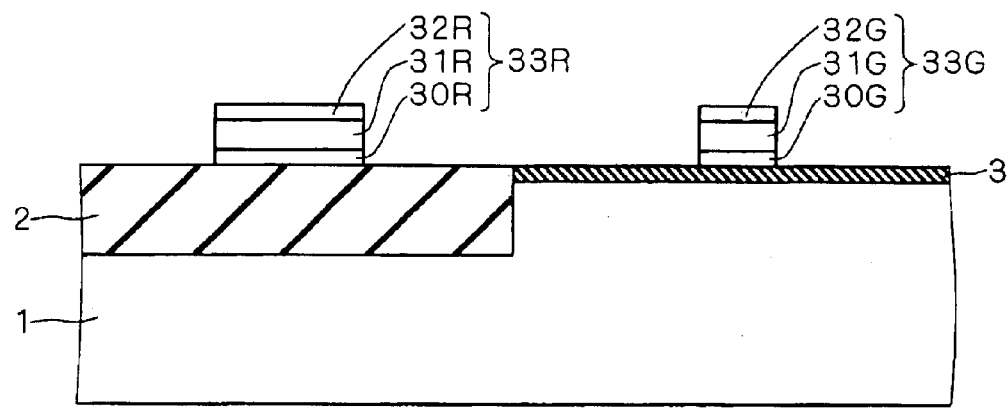
Figure 28:
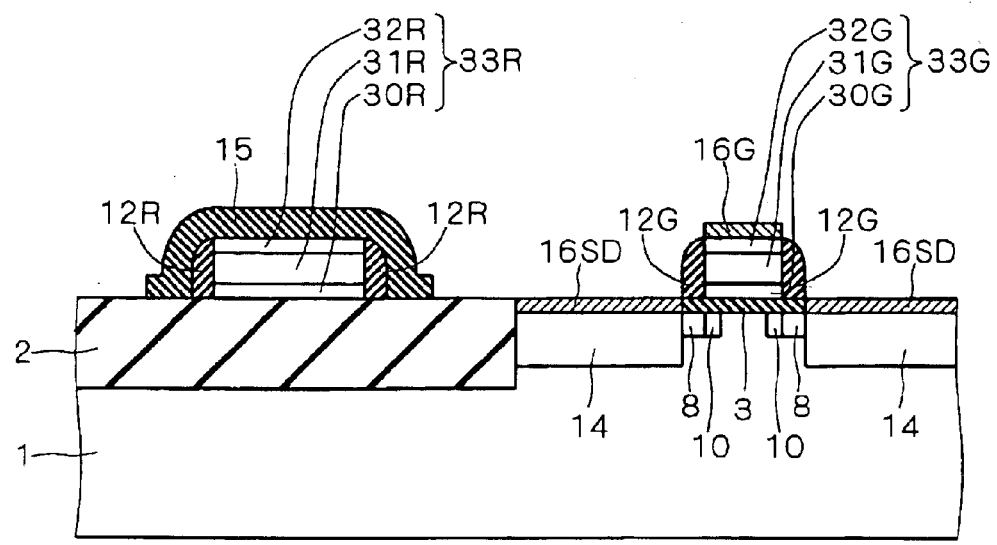

FIGS. 26 to 28 are cross-sectional views showing the sequence of manufacturing processes in a manufacturing method of a semiconductor device in accordance with a third preferred embodiment of the present invention. The third preferred embodiment will be explained based on an example in which a p-channel MOSFET is formed as a transistor.

With reference to FIG. 1, first of all, an element isolation insulating film 2 is partly formed in an upper surface of an n-type silicon substrate 1 by using a well-known trench isolation technique.

With reference to FIG. 2, next, the silicon oxide film 3 is formed on the upper surface of the silicon substrate 1 in the transistor forming region by using a thermal oxidation method.

With reference to FIG. 26, next, a silicon-germanium (SiGe) film 30 containing no doped impurities is formed on the entire surface of the structure shown in FIG. 2 by using the CVD method. Next, a polysilicon film 31 containing no doped impurities is formed on the silicon-germanium film 30 by using the CVD method. Next, a silicon-germanium film 32 containing no doped impurities is formed on the polysilicon film 31 by using the CVD method.

With reference to FIG. 27, next, the silicon-germanium films 30 and 32 and the polysilicon film 31 are patterned by using the photolithography technique and the anisotropic dry etching method to form a resistance element 33R on the element isolation insulating film 2 and also form a gate electrode 33G on the silicon oxide film 3. The resistance element 33R has a multilayered structure consisting of a silicon-germanium film 30R, a polysilicon film 31R, and a silicon-germanium film 32R laminated in this order. In the same manner, the gate electrode 33G has a multilayered structure consisting of a silicon-germanium film 30G, a polysilicon film 31G, and a silicon-germanium film 32G laminated in this order.

Next, like the process shown in FIG. 5, with the photoresist 6 as an implantation mask, the p-type impurities 7 such as boron are ion-implanted from a direction substantially normal to the upper surface of the silicon substrate 1 (i.e., from the vertical direction), so as to form the LDD region 8.

Next, like the process shown in FIG. 6, with the photoresist 6 as an implantation mask, the n-type impurities 9 are ion-implanted from a direction inclined with respect to the above-described vertical direction, to form the pocket region 10.

Next, like the processes shown in FIGS. 7 and 8, the sidewall spacer 12R is formed on the side surface of the resistance element 33R and the sidewall spacer 12G is formed on the side surface of the gate electrode 33G.

Next, like the process shown in FIG. 9, the p-type impurities 13 such as boron are ion-implanted from a direction substantially normal to the upper surface of the silicon substrate 1 so as to form the source-drain region 14. The impurities 13 are also implanted into the resistance element 33R and into the gate electrode 33G. Next, a predetermined thermal treatment is performed to activate the LDD region 8, the pocket region 10, and the source-drain region 14.

Next, like the process shown in FIG. 10, the silicon oxide film 15 is formed so as to cover the resistance element 33R and the sidewall spacer 12R.

With reference to FIG. 28, next, a metallic film of cobalt or the like is formed on the entire surface. Subsequently, the cobalt silicide layers 16G and 16SD are formed by performing a predetermined thermal treatment.

As described above, according to the manufacturing method of a semiconductor device in accordance with the third preferred embodiment, the bottom surface of the polysilicon film 31R is covered by the silicon-germanium film 30R and the upper surface of the polysilicon film 3IR is covered by the silicon-germanium film 32R as shown in FIG. 27. Furthermore, under the condition that the bottom and upper surfaces of the polysilicon film 31R are covered by the silicon-germanium films 30R and 32R, the thermal treatment is performed to activate the LDD region 8, the pocket region 10, and the source-drain region 14. Accordingly, by the functions of the silicon-germanium films 30R and 32R, it becomes possible to prevent the impurities 13 such as boron contained in the polysilicon film 31R from diffusing out of the bottom and the upper surfaces of the polysilicon film 31 R during this thermal treatment (and the thermal treatment for forming the cobalt silicide layers 16G and 16SD). As a result, it becomes possible to accurately set a resistance value of the resistance element 33R. Furthermore, it becomes possible to suppress unevenness in the resistance value of the resistance element on the wafer surface.

Fourth Preferred Embodiment

Figure 29:
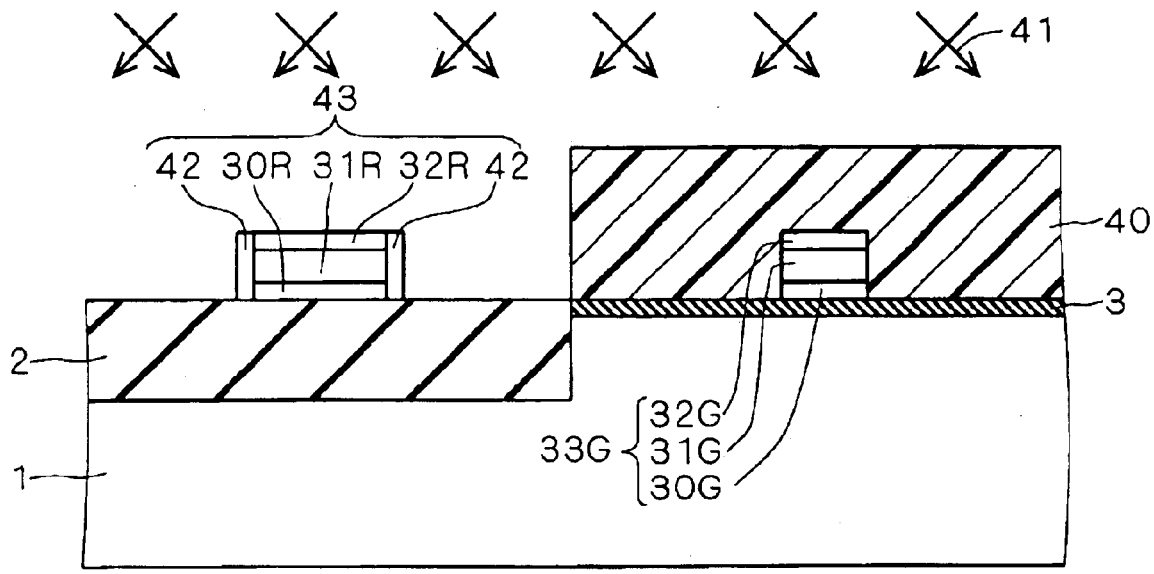
FIGS. 29 and 30 are cross-sectional views showing the sequence of manufacturing processes in a manufacturing method of a semiconductor device in accordance with a fourth preferred embodiment of the present invention.
Figure 30:
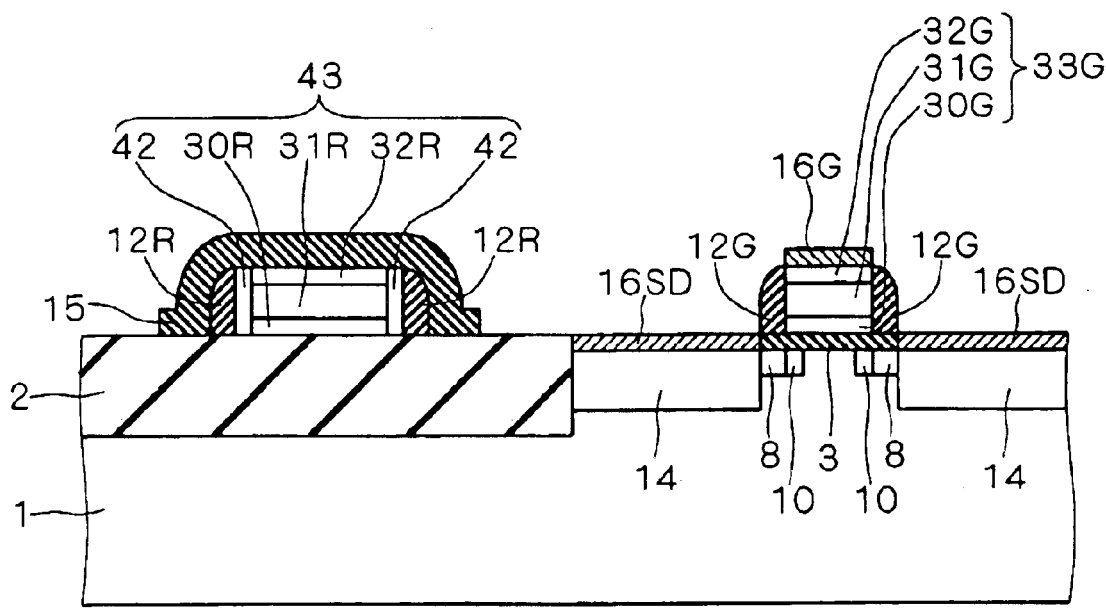

FIGS. 29 and 30 are cross-sectional views showing the sequence of manufacturing processes in a manufacturing method of a semiconductor device in accordance with a fourth preferred embodiment of the present invention. First of all, the structure shown in FIG. 27 is obtained by using a method similar to that disclosed in the above-described third preferred embodiment. With reference to FIG. 29, next, a photoresist 40 is formed by using the photolithography technique so as to cover the transistor forming region. Next, germanium 41 is ion-implanted from a direction inclined with respect to the vertical direction of the upper surface of the silicon substrate 1. The dose is in the order of $10^{15}/cm^2$ or more. Through this processing, a silicon-germanium film 42 is formed in the side surface of the resistance element 33R. As a result, the resistance element 43 is obtained. Regarding the resistance element 43, the side surface of the polysilicon film 31R is covered by the silicon-germanium film 42. Subsequently, the structure shown in FIG. 30 is obtained by performing the process similar to that disclosed in the above-described third preferred embodiment.

As described above, according to the manufacturing method of a semiconductor device in accordance with the fourth preferred embodiment, the surface (i.e., bottom surface, upper surface, and side surface) of the polysilicon film 31R is covered by the silicon-germanium films 30R, 32R and 42 as shown in FIG. 28. Furthermore, under the condition that the surface of the polysilicon film 31R is covered by the silicon-germanium films 30R, 32R and 42, the thermal treatment is performed to activate the LDD region 8, the pocket region 10, and the source-drain region 14. Accordingly, by the functions of the silicon-germanium films 30R, 32R and 42, it becomes possible to prevent the impurities 13 such as boron contained in the polysilicon film 31R from diffusing out of the polysilicon film 31R during this thermal treatment (and the thermal treatment for forming the cobalt silicide layers 16G and 16SD). As a result, it becomes possible to accurately set a resistance value of the resistance element 43. Furthermore, it becomes possible to suppress unevenness in the resistance value of the resistance element on the wafer surface.

As a modification, it is possible to arbitrarily form one or two of the silicon-germanium films 30R, 32R and 42.

Fifth Preferred Embodiment

Figure 31:
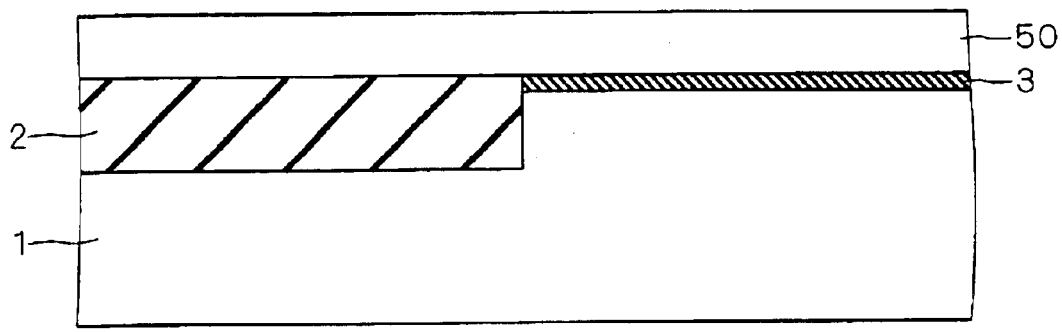
FIGS. 31 to 34 are cross-sectional views showing the sequence of manufacturing processes in a manufacturing method of a semiconductor device in accordance with a fifth preferred embodiment of the present invention.

FIGS. 31 to 34 are cross-sectional views showing the sequence of manufacturing processes in a manufacturing method of a semiconductor device in accordance with a fifth preferred embodiment of the present invention. First, the structure shown in FIG. 2 is obtained by using a method similar to that disclosed in the above-described first preferred embodiment. With reference to FIG. 31, next, an amorphous silicon film 50 is formed on the entire surface of the structure shown in FIG. 2 by using the CVD method.

Figure 32:
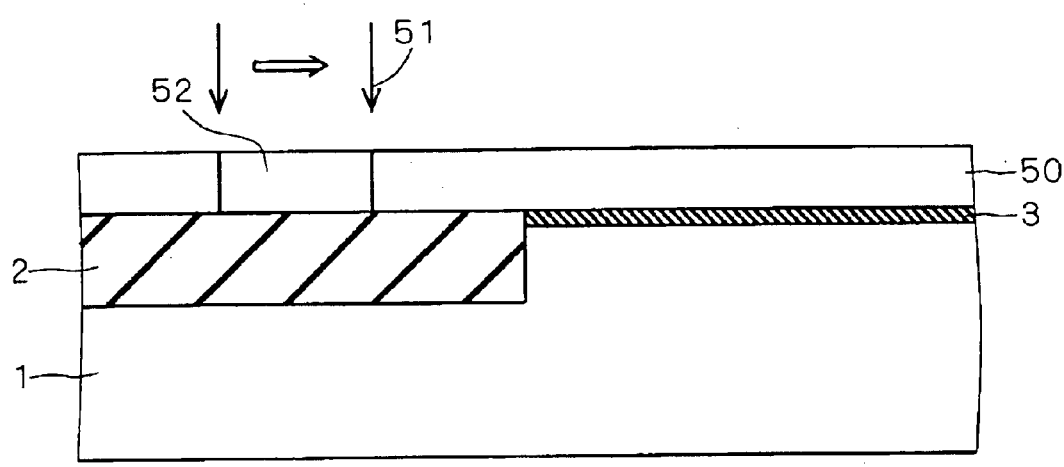

With reference to FIG. 32, next, the amorphous silicon film 50 is partly single-crystallized by using a laser annealing method. More specifically, a region of the amorphous silicon film 50 where a resistance element is to be formed is scanned by a laser beam 51. The energy of the laser beam 51 is in the level of approximately 200 to 1,000 $mJ/cm^2$. Through this processing, a single-crystal silicon film 52 is formed.

Figure 33:
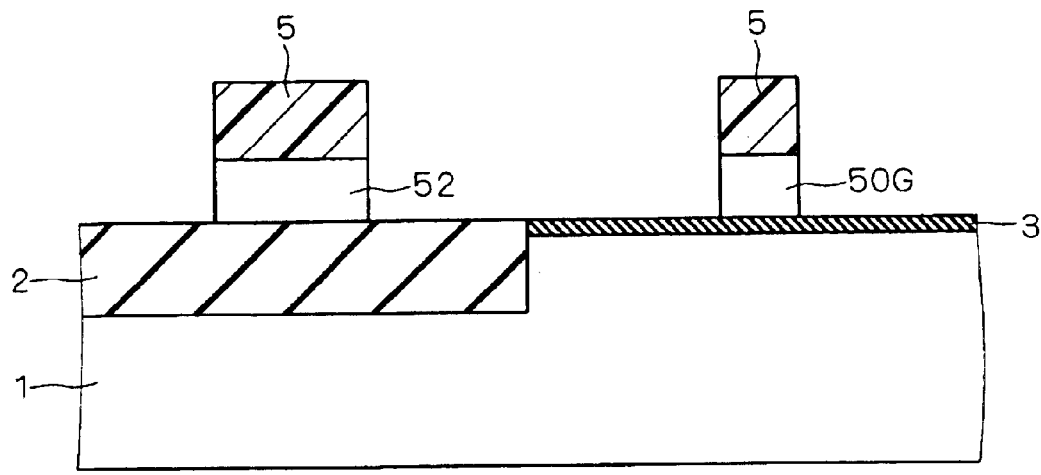
Figure 34:
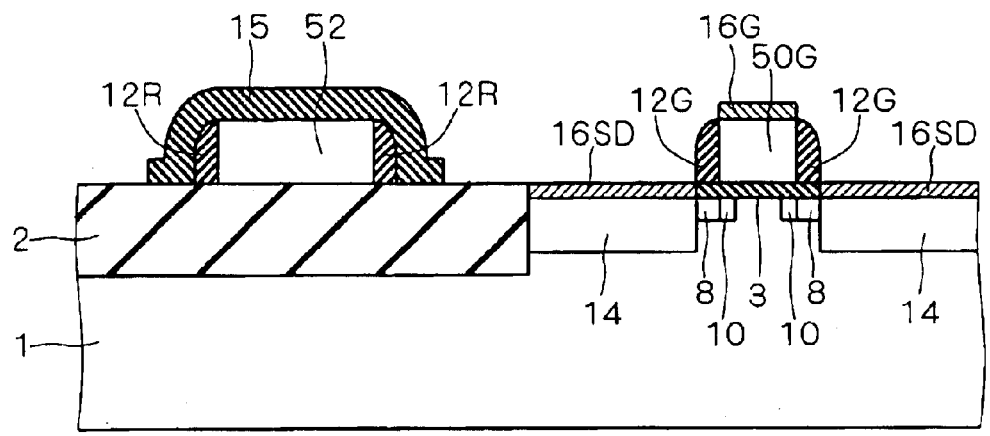

With reference to FIG. 33, next, the photoresist 5 is formed by using the photolithography technique. The photoresist 5 is formed on the single-crystal silicon film 52. Furthermore, the photoresist 5 is partly formed on the amorphous silicon film 50. Next, with the photoresist 5 as an etching mask, the amorphous silicon film 50 is partly removed by using the anisotropic dry etching method. Through this processing, an amorphous silicon film 50G is formed. The single-crystal silicon film 52, functioning as a resistance element, is formed on the element isolation insulating film 2. The amorphous silicon film 50G, functioning as a gate electrode of MOSFET, is formed on the silicon oxide film 3. Subsequently, the structure shown in FIG. 34 is obtained by performing the process similar to that shown in the above-described first preferred embodiment.

Although the foregoing explanation was given based on an example in which the invention according to the fifth preferred embodiment is incorporated into the basic structure of the above-described first preferred embodiment, the invention according to the fifth preferred embodiment can be applied to any one of the above-described second to fourth preferred embodiments.

As described above, the manufacturing method of a semiconductor device in accordance with the fifth preferred embodiment forms the resistance element made of a single-crystal silicon instead of the resistance element made of a polysilicon. In a case where the resistance element is formed by doping impurities in the polysilicon film, the resistance value of the resistance element may slightly deviate from a desired value due to segregation of the impurities on the grain boundary surface. On the contrary, according to the manufacturing method of a semiconductor device in accordance with the fifth preferred embodiment, the resistance element is formed by implanting the impurities 13 into the single-crystal silicon film 52. Hence, it becomes possible to suppress the resistance value from deviating due to segregation of the impurities. Accordingly, it becomes possible to accurately set the resistance value of the resistance element.

Sixth Preferred Embodiment

Figure 35:
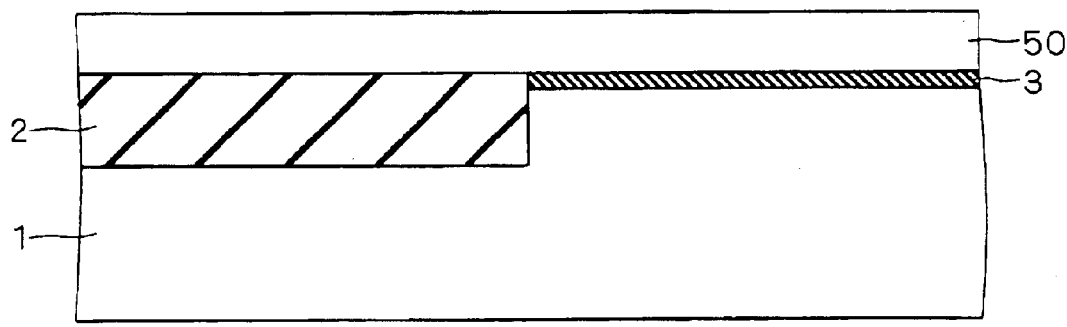
FIGS. 35 to 38 are cross-sectional views showing the sequence of manufacturing processes in a manufacturing method of a semiconductor device in accordance with a sixth preferred embodiment of the present invention.

FIGS. 35 to 38 are cross-sectional views showing the sequence of manufacturing processes in a manufacturing method of a semiconductor device in accordance with a sixth preferred embodiment of the present invention. First, the structure shown in FIG. 2 is obtained by using a method similar to that disclosed in the above-described first preferred embodiment. With reference to FIG. 35, next, the amorphous silicon film 50 is formed on the entire surface of the structure shown in FIG. 2 by using the CVD method.

Figure 36:
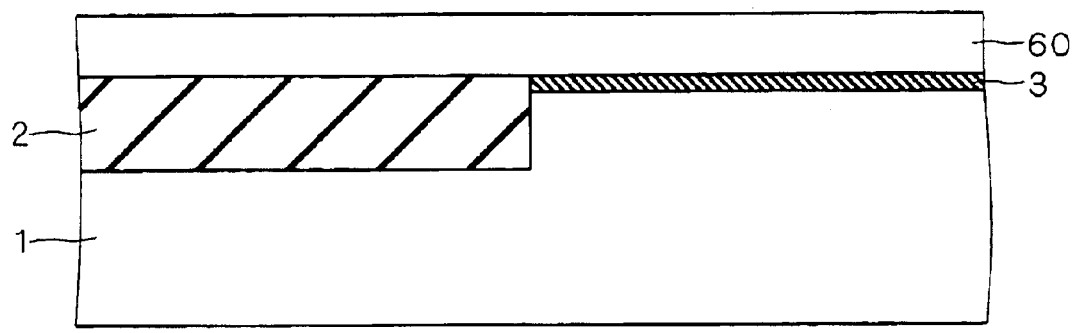

With reference to FIG. 36, next, the amorphous silicon is polysiliconized by performing a thermal treatment in a furnace at a low temperature (not higher than 800° C.) for a long time (1 to 10 hours). Through this processing, a polysilicon film 60 is formed. The grain size of the polysilicon film 60 is larger than the grain size of the polysilicon film 4 and in the level of approximately 50 to 100 nm.

Figure 37:
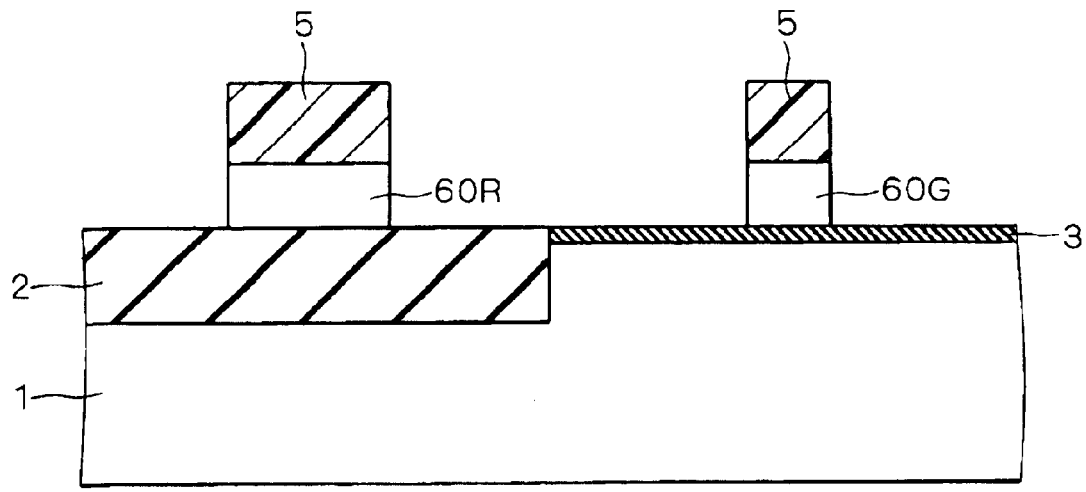
Figure 38:
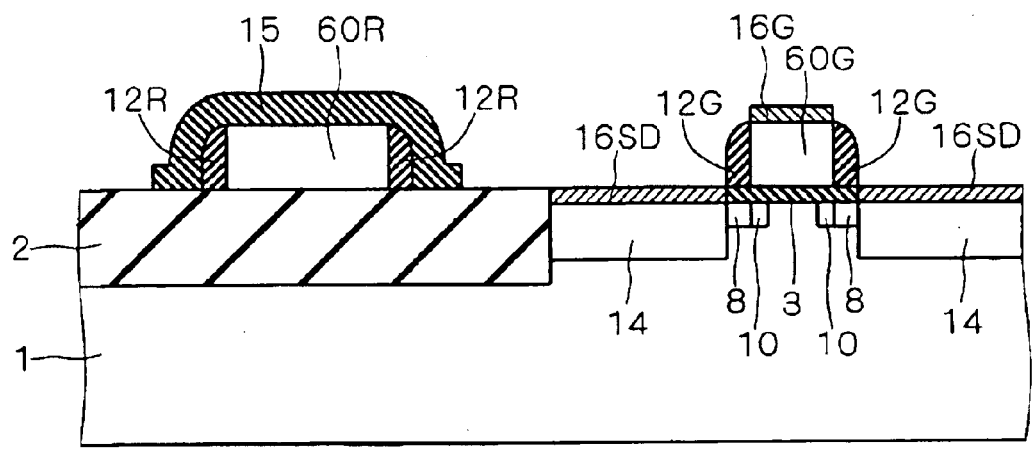

With reference to FIG. 37, next, the photoresist 5 is formed by using the photolithography technique. Next, with the photoresist 5 as an etching mask, the polysilicon film 60 is partly removed by the anisotropic dry etching method. Through this processing, the polysilicon films 60R and 60G are formed. The polysilicon film 60R, functioning as a resistance element, is formed on the element isolation insulating film 2. The polysilicon film 60G, functioning as a gate electrode of MOSFET, is formed on the silicon oxide film 3. Subsequently, the structure shown in FIG. 38 is obtained by performing the process similar to that disclosed in the above-described first preferred embodiment.

Although the foregoing explanation was given based on an example in which the invention according to the sixth preferred embodiment is incorporated into the basic structure of the above-described first preferred embodiment, the invention according to the sixth preferred embodiment can be applied to any one of the above-described second to fourth preferred embodiments.

As described above, according to the manufacturing method of a semiconductor device in accordance with the sixth preferred embodiment, the resistance element is formed by using the polysilicon film 60R having the grain size larger than that of the polysilicon film 4R. Accordingly, the grain boundary surface becomes small, and relatively less amount of impurities deposit on the boundary surface. As a result, it becomes possible to suppress the resistance value from deviating due to segregation of the impurities. Accordingly, it becomes possible to accurately set the resistance value of the resistance element.

While the invention has been shown and described in detail, the foregoing description is in all aspects illustrative and not restrictive. It is therefore understood that numerous other modifications and variations can be devised without departing from the scope of the invention.

What is claimed is:

1. A manufacturing method of a semiconductor device comprising the steps of:
   (a) forming an element isolation insulating film in a main surface of a semiconductor substrate;
   (b) forming a gate insulating film on said main surface of said semiconductor substrate in an element forming region defined by said element isolation insulating film;
   (c) forming a semiconductor film on said element isolation insulating film and on said gate insulating film;
   (d) forming a resistance element on said element isolation insulating film and forming a gate electrode on said gate insulating film by patterning said semiconductor film;
   (e) forming a mask material so as to cover said resistance element;
   (f) forming a first source-drain region in said main surface of said semiconductor substrate in said element forming region by ion-implanting first impurities of a first conductivity type with said mask material as an implantation mask;
   (g) forming a sidewall spacer on a side surface of said resistance element, said step (g) being executed after said step (f);
   (h) by ion-implanting second impurities of said first conductivity type, implanting said second impurities into said resistance element and forming a second source-drain region in said main surface of said semiconductor substrate in said element forming region, said step (h) being executed after said step (g); and
   (i) performing a thermal treatment to activate said second impurities.

2. The manufacturing method of a semiconductor device according to claim 1, further comprising a step of
   (j) forming a pocket region in said main surface of said semiconductor substrate at a region under an end of said gate electrode by ion-implanting third impurities of a second conductivity type with said mask material as an implantation mask.

3. The manufacturing method of a semiconductor device according to claim 1, further comprising a step of
   (k) forming a nitride film on an upper surface of said resistance element, said step (k) being executed before said step (i).

4. The manufacturing method of a semiconductor device according to claim 1, further comprising a step of
   (l) forming a nitride film on a side surface of said resistance element, said step (l) being executed before said step (i).

5. The manufacturing method of a semiconductor device according to claim 1, further comprising a step of
   (m) nitriding an upper surface of said element isolation insulating film, said step (m) being executed before said step (c).

6. The manufacturing method of a semiconductor device according to claim 1, further comprising a step of
   (n) forming a silicon-germanium film on said element isolation insulating film and on said gate insulating film,
   wherein said semiconductor film is formed on said silicon-germanium film in said step (c).

7. The manufacturing method of a semiconductor device according to claim 1, further comprising a step of
   (o) forming a silicon-germanium film on said semiconductor film.

8. The manufacturing method of a semiconductor device according to claim 1, wherein said semiconductor film contains silicon,
   and said manufacturing method further comprises a step of
   (p) ion-implanting germanium into a side surface of said semiconductor film.

9. The manufacturing method of a semiconductor device according to claim 1, wherein said resistance element is a single-crystal silicon film.

10. The manufacturing method of a semiconductor device according to claim 9, wherein said semiconductor film is an amorphous silicon film, and said manufacturing method further comprises a step of (q) irradiating a laser beam onto a portion of said amorphous silicon film corresponding to said resistance element, said step (q) being executed before said step (d).

11. The manufacturing method of a semiconductor device according to claim 1, wherein said semiconductor film is an amorphous silicon film, and said manufacturing method further comprises a step of (r) changing said amorphous silicon film into a polysilicon film by performing a thermal treatment at a low temperature for a long time, said step (r) being executed before said step (d).

* * * * *